US012775044B2

(12) United States Patent
Kandula et al.

(10) Patent No.: US 12,775,044 B2
(45) Date of Patent: Oct. 27, 2026

(54) METHOD AND APPARATUS FOR ACCESSING REMOTE TEST DATA REGISTERS

(71) Applicant: Intel Corporation, Santa Clara, CA (US)

(72) Inventors: Rakesh Kandula, Bangalore (IN); Sankaran Menon, Austin, TX (US); Rolf Kuehnis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 26 days.

(21) Appl. No.: 17/954,658

(22) Filed: Sep. 28, 2022

(65) Prior Publication Data

US 2024/0103077 A1 Mar. 28, 2024

(51) Int. Cl.
*G01R 31/3185* (2006.01)
*G01R 31/319* (2006.01)

(52) U.S. Cl.
CPC ................ *G01R 31/318533* (2013.01); *G01R 31/31907* (2013.01); *G01R 31/31924* (2013.01)

(58) Field of Classification Search
CPC ...... G01R 31/318533; G01R 31/31907; G01R 31/31924
See application file for complete search history.

(56) References Cited

U.S. PATENT DOCUMENTS

| | | | | |
|---|---|---|---|---|
| 11,243,252 B1 * | 2/2022 | Seetharaman | ..... | G01R 31/3177 |
| 11,782,092 B1 * | 10/2023 | Jain | ................ | G01R 31/318533 714/726 |
| 2019/0128963 A1 * | 5/2019 | Wu | ................ | G01R 31/318558 |

OTHER PUBLICATIONS

"Introduction to JTAG", Technical Guide to JTAG, https://xjtag.com/about-jtag/, downloaded Oct. 31, 2022, 8 pages.

* cited by examiner

*Primary Examiner* — Bryce P Bonzo
*Assistant Examiner* — Xinyuan Yu
(74) *Attorney, Agent, or Firm* — Nicholson De Vos Webster & Elliott LLP

(57) ABSTRACT

Time to read the data registers in a remote Test Access Port (TAP) in a subsystem in a System-on-Chip (SoC) is reduced by reading multiple data registers in remote Test Access Ports in parallel. A Test Access Port Bridge provides access to multiple same width data registers in parallel. The same width data registers can be for the same function or different functions. The subsystems with a remote Test Access Port in the SoC can include Peripheral Component Interconnect Express (PCIe), Voltage Droop Monitors (VDMs), In-Die Variation (IDV) Monitor fub-lets, Temperature Sensors, Performance Monitors and telemetry subsystems.

20 Claims, 10 Drawing Sheets

METHOD AND APPARATUS FOR ACCESSING REMOTE TEST DATA REGISTERS

BACKGROUND

A System on Chip (SoC) typically has a JTAG (Joint Test Action Group) port. The JTAG port is an industry standard interface that implements a serial communications interface to provide access to a set of test registers in the SoC. Internal monitoring capabilities (for example, temperature, voltage and current) in the SoC are accessible via the JTAG port.

The Institute of Electrical and Electronics Engineers (IEEE) 1149.7 Standard JTAG port uses two pins on the SoC. The two pins are TMSC (Test Serial Data) and TCKC (Test Clock). One bit of data is transferred in and out on TMSC per TCK rising clock edge.

The Institute of Electrical and Electronics Engineers (IEEE) 1149.1 Standard JTAG port uses five pins on the SoC. The five pins are TDI (Test Data In), TDO (Test Data Out), TCK (Test Clock), TMS (Test Mode Select), and optional TRST (Test Reset). The clock input is at the TCK pin. Data is written and read serially via the JTAG port with one bit of data transferred in from TDI, and out to TDO serially per TCK rising clock edge.

IEEE 1687 (Internal JTAG (IJTAG)) is standard that defines a way to access monitoring data inside an integrated circuit using the IEEE 1149.1 test access port (TAP).

Modules in the SoC expose test access ports (TAPs). A host communicates with the TAPs via the JTAG port that uses five pins by manipulating TMS and TDI in conjunction with TCK, and reading results through TDO. Each TAP has one instruction register (IR) and multiple data registers (DR). The number of bits in the data registers varies between TAPs. The data registers are combined through TDI and TDO to form a large shift register. All information (instructions, test data, and test results) is communicated in a serial format.

BRIEF DESCRIPTION OF DRAWINGS

Various examples in accordance with the present disclosure will be described with reference to the drawings, in which.

DETAILED DESCRIPTION

Figure 1:
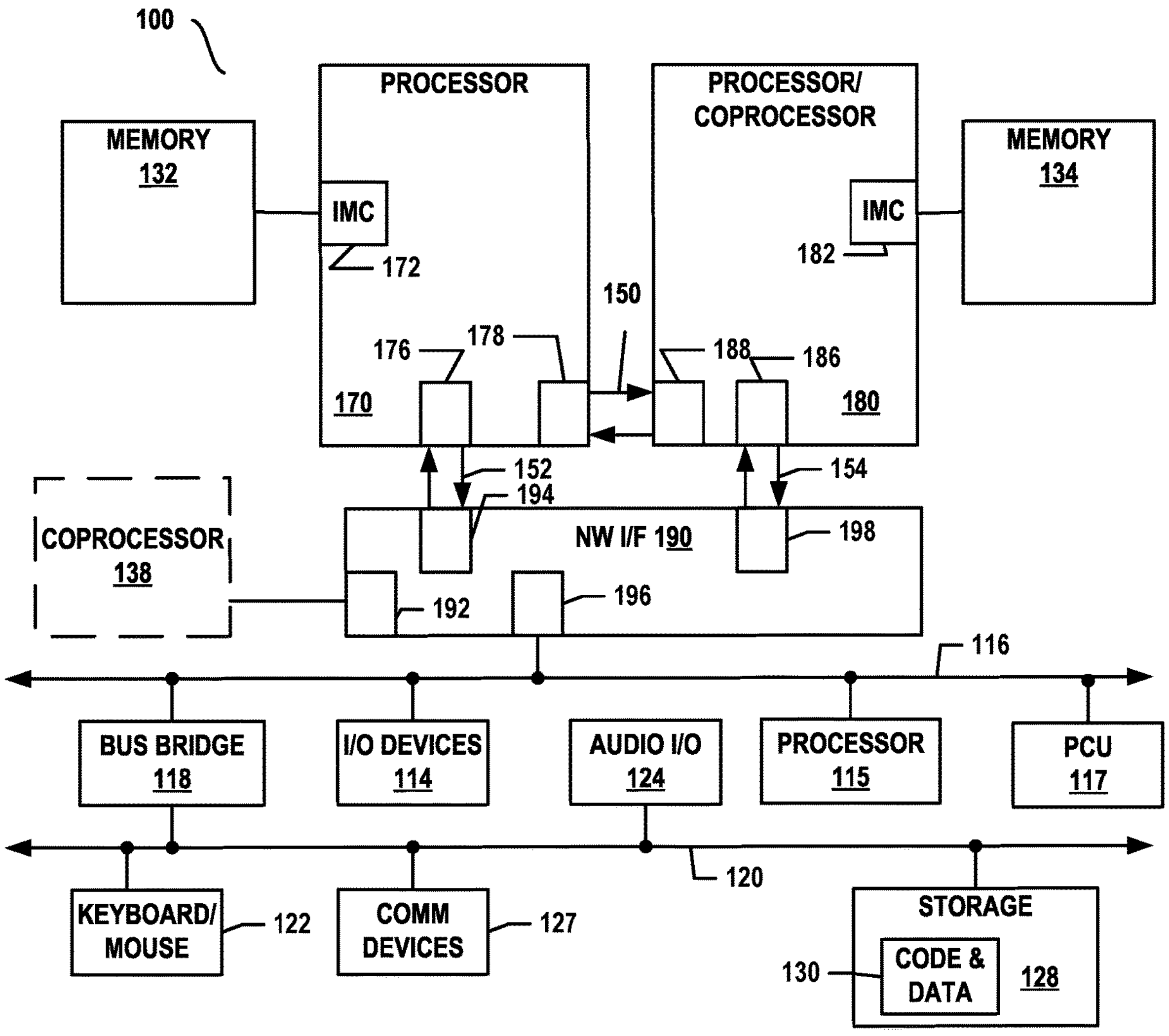
FIG. 1 illustrates an example computing system.

The Test Access Port (TAP) is a state machine with transitions controlled by the Test Mode Select (TMS) signal. The state machine has multiple states for the Instruction register (IR) and the data register (DR). States for the DR include Capture DR, Shift DR, Pause_DR and Update_DR. A value (opcode, instruction, register identifier) stored in the instruction register (IR) selects the DR register and the value (parameter) stored in the DR register is shifted out serially from the selected DR register while the TAP is in the Shift-DR state.

As only one DR register can be read by the TAP at a time, it takes 16 TAP shift cycles to read two 8-bit DR registers. The DR registers can be used to store SoC parameters, for example, Performance Monitor counters, Voltage Droop Monitor (VDM) counter registers, In-Die Variation Monitors (IDV) counter registers, Duty Cycle Monitors, Perfmon Counters, C-State Residency Counters, and Telemetry information.

The DR registers are read during operation of the SoC for infield testing and for silicon life cycle management. Infield testing can detect latent faults which may not be apparent or readily detected during manufacturing testing stage but may develop over a period of time during infield testing. Silicon Life Cycle Management (SLM) is associated with periodic monitoring as well as analysis and optimization of SoCs and semiconductor devices during development, manufacturing, testing stages and while the SoC is deployed in an end-user system. Additionally, the data read from the DR registers can also be sent to the cloud during the regular mission-mode of the silicon/platform for infield and silicon life cycle management purposes. Reading the DR registers serially, one DR register at a time is very time consuming.

Time to read the data registers in a remote Test Access Port in a subsystem in a System-on-Chip (SoC) is reduced by reading multiple data registers in remote Test Access Ports in parallel. A test Access Port Bridge provides access to multiple same width data registers in parallel. The same width data registers can be for the same function or different functions. The same width data registers have the same number of bits, for example, N-bits, where N is 8, 16, 32, 64, 128 or $2^m$ where m is greater than 7. The subsystems with a remote Test Access Port in the SoC can include Peripheral Component Interconnect Express (PCIe), Voltage Droop Monitors (VDMs), In-Die Variation (IDV) Monitor fub-lets, Temperature Sensors, Performance Monitors and telemetry subsystems.

Detailed below are descriptions of example computer architectures. Other system designs and configurations known in the arts for laptop, desktop, and handheld personal computers (PC)s, personal digital assistants, engineering workstations, servers, disaggregated servers, network devices, network hubs, switches, routers, embedded processors, digital signal processors (DSPs), graphics devices, video game devices, set-top boxes, micro controllers, cell phones, portable media players, hand-held devices, and various other electronic devices, are also suitable. In general, a variety of systems or electronic devices capable of incorporating a processor and/or other execution logic as disclosed herein are generally suitable.

FIG. 1 illustrates an example computing system. Multiprocessor system 100 is an interfaced system and includes a plurality of processors or cores including a first processor 170 and a second processor 180 coupled via an interface 150 such as a point-to-point (P-P) interconnect, a fabric, and/or bus. In some examples, the first processor 170 and the second processor 180 are homogeneous. In some examples, first processor 170 and the second processor 180 are heterogenous. Though the example system 100 is shown to have two processors, the system may have three or more processors, or may be a single processor system. In some examples, the computing system is a system on a chip (SoC).

Processors 170 and 180 are shown including integrated memory controller (IMC) circuitry 172 and 182, respectively. Processor 170 also includes interface circuits 176 and 178; similarly, second processor 180 includes interface circuits 186 and 188. Processors 170, 180 may exchange information via the interface 150 using interface circuits 178, 188. IMCs 172 and 182 couple the processors 170, 180 to respective memories, namely a memory 132 and a memory 134, which may be portions of main memory locally attached to the respective processors. The memory 132 and memory 134 to store instructions and data.

Processors 170, 180 may each exchange information with a network interface (NW UF) 190 via individual interfaces 152, 154 using interface circuits 176, 194, 186, 198. The network interface 190 (e.g., one or more of an interconnect, bus, and/or fabric, and in some examples is a chipset) may optionally exchange information with a co-processor 138 via an interface circuit 192. In some examples, the co-processor 138 is a special-purpose processor, such as, for example, a high-throughput processor, a network or communication processor, compression engine, graphics processor, general purpose graphics processing unit (GPGPU), neural-network processing unit (NPU), embedded processor, or the like.

A shared cache (not shown) may be included in either processor 170, 180 or outside of both processors, yet connected with the processors via an interface such as a point to point (P-P) interconnect, such that either or both processors' local cache information may be stored in the shared cache if a processor is placed into a low power mode.

Network interface 190 may be coupled to a first interface 116 via interface circuit 196. In some examples, first interface 116 may be an interface such as a Peripheral Component Interconnect (PCI) interconnect, a PCI Express interconnect or another I/O interconnect. In some examples, first interface 116 is coupled to a power control unit (PCU) 117, which may include circuitry, software, and/or firmware to perform power management operations with regard to the processors 170, 180 and/or co-processor 138. PCU 117 provides control information to a voltage regulator (not shown) to cause the voltage regulator to generate the appropriate regulated voltage. PCU 117 also provides control information to control the operating voltage generated. In various examples, PCU 117 may include a variety of power management logic units (circuitry) to perform hardware-based power management. Such power management may be wholly processor controlled (e.g., by various processor hardware, and which may be triggered by workload and/or power, thermal or other processor constraints) and/or the power management may be performed responsive to external sources (such as a platform or power management source or system software).

PCU 117 is illustrated as being present as logic separate from the processor 170 and/or processor 180. In other cases, PCU 117 may execute on a given one or more of cores (not shown) of processor 170 or 180. In some cases, PCU 117 may be implemented as a microcontroller (dedicated or general-purpose) or other control logic configured to execute its own dedicated power management code, sometimes referred to as P-code. In yet other examples, power management operations to be performed by PCU 117 may be implemented externally to a processor, such as by way of a separate power management integrated circuit (PMIC) or another component external to the processor. In yet other examples, power management operations to be performed by PCU 117 may be implemented within BIOS or other system software.

Various I/O devices 114 may be coupled to first interface 116, along with a bus bridge 118 which couples first interface 116 to a second interface 120. In some examples, one or more additional processor(s) 115, such as coprocessors, high throughput many integrated core (MIC) processors, GPGPUs, accelerators (such as graphics accelerators or digital signal processing (DSP) units), field programmable gate arrays (FPGAs), or any other processor, are coupled to first interface 116. In some examples, second interface 120 may be a low pin count (LPC) interface. Various devices may be coupled to second interface 120 including, for example, a keyboard and/or mouse 122, communication devices 127 and storage circuitry 128. Storage circuitry 128 may be one or more non-transitory machine-readable storage media as described below, such as a disk drive or other mass storage device which may include instructions/code and data 130 and may implement the storage 'ISAB03 in some examples. Further, an audio I/O 124 may be coupled to second interface 120. Note that other architectures than the point-to-point architecture described above are possible. For example, instead of the point-to-point architecture, a system such as multiprocessor system 100 may implement a multi-drop interface or other such architecture.

Example Core Architectures, Processors, and Computer Architectures

Processor cores may be implemented in different ways, for different purposes, and in different processors. For instance, implementations of such cores may include: 1) a general purpose in-order core intended for general-purpose computing; 2) a high-performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput) computing. Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip (SoC) that may be included on the same die as the described CPU (sometimes referred to as the application core(s) or application processor(s)), the above described coprocessor, and additional functionality.

Figure 2:
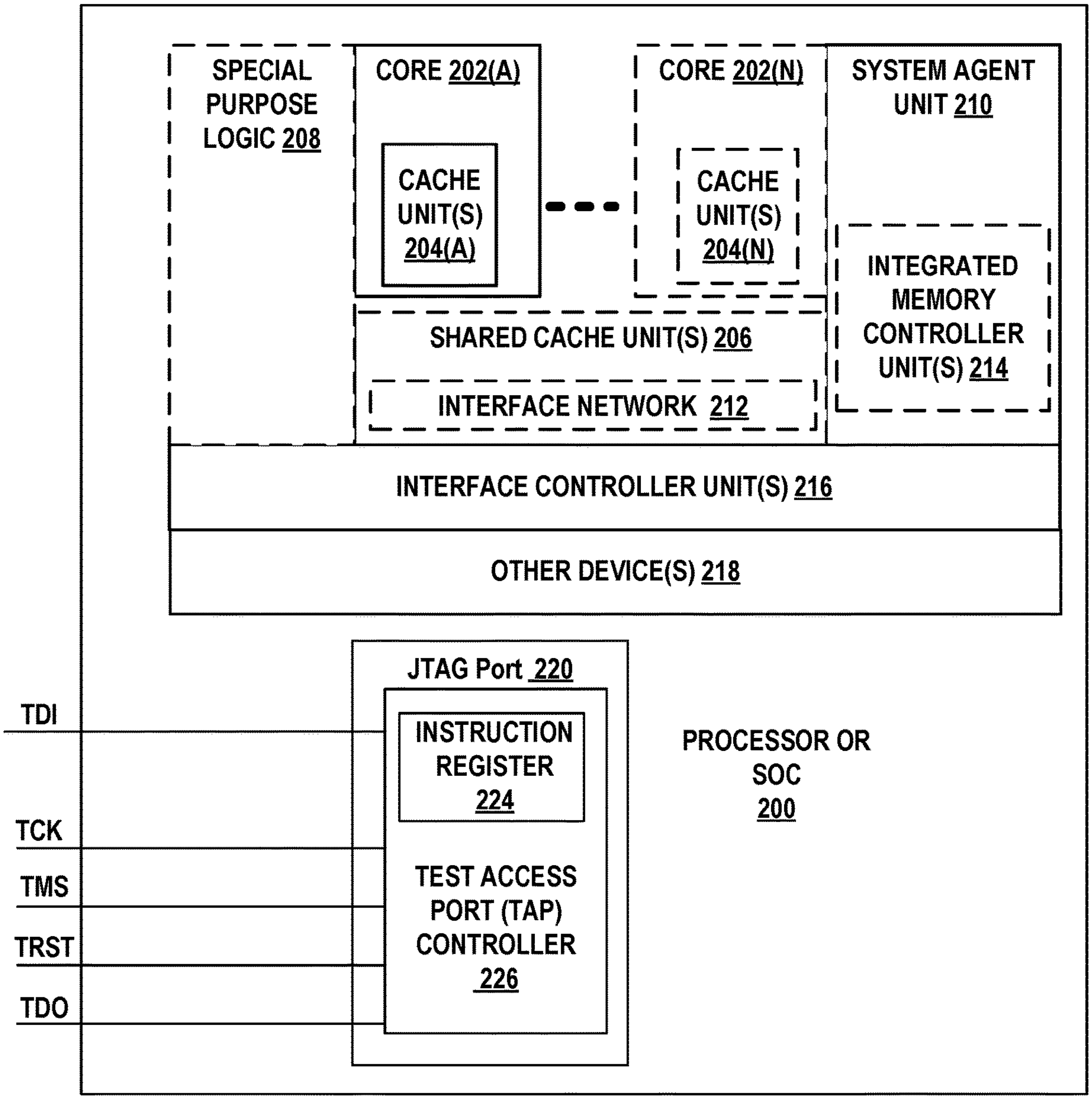
FIG. 2 illustrates a block diagram of an example processor and/or System on a Chip (SoC) that may have one or more cores, an integrated memory controller and a JTAG port.

FIG. 2 illustrates a block diagram of an example processor and/or SoC 200 that may have one or more cores, an integrated memory controller and a JTAG port 220. The SoC 200 includes different components (hardware elements), also called "blocks" or subsystems.

The solid lined boxes illustrate a processor 200 with a single core 202(A), system agent unit circuitry 210, and a set of one or more interface controller unit(s) circuitry 216, while the optional addition of the dashed lined boxes illustrates an alternative processor 200 with multiple cores 202(A)-(N), a set of one or more integrated memory controller unit(s) circuitry 214 in the system agent unit circuitry 210, and special purpose logic 208, as well as a set of one or more interface controller units circuitry 216. Note that the processor 200 may be one of the processors 170 or 180, or co-processor 138 or 115 of FIG. 1.

Thus, different implementations of the processor 200 may include: 1) a CPU with the special purpose logic 208 being integrated graphics and/or scientific (throughput) logic (which may include one or more cores, not shown), and the cores 202(A)-(N) being one or more general purpose cores (e.g., general purpose in-order cores, general purpose out-of-order cores, or a combination of the two); 2) a coprocessor with the cores 202(A)-(N) being a large number of special purpose cores intended primarily for graphics and/or scientific (throughput); and 3) a coprocessor with the cores 202(A)-(N) being a large number of general purpose in-order cores. Thus, the processor 200 may be a general-purpose processor, coprocessor or special-purpose processor, such as, for example, a network or communication processor, compression engine, graphics processor, GPGPU (general purpose graphics processing unit), a high throughput many integrated core (MIC) coprocessor (including 30 or more cores), embedded processor, or the like. The processor may be implemented on one or more chips. The processor 200 may be a part of and/or may be implemented on one or more substrates using any of a number of process technologies, such as, for example, complementary metal oxide semiconductor (CMOS), bipolar CMOS (BiCMOS), P-type metal oxide semiconductor (PMOS), or N-type metal oxide semiconductor (NMOS).

A memory hierarchy includes one or more levels of cache unit(s) circuitry 204(A)-(N) within the cores 202(A)-(N), a set of one or more shared cache unit(s) circuitry 206, and external memory (not shown) coupled to the set of integrated memory controller unit(s) circuitry 214. The set of one or more shared cache unit(s) circuitry 206 may include one or more mid-level caches, such as level 2 (L2), level 3 (L3), level 4 (L4), or other levels of cache, such as a last level cache (LLC), and/or combinations thereof. While in some examples interface network circuitry 212 (e.g., a ring interconnect) interfaces the special purpose logic 208 (e.g., integrated graphics logic), the set of shared cache unit(s) circuitry 206, and the system agent unit circuitry 210, alternative examples use any number of well-known techniques for interfacing such units. In some examples, coherency is maintained between one or more of the shared cache unit(s) circuitry 206 and cores 202(A)-(N). In some examples, interface controller units circuitry 216 couple the cores 202 to one or more other devices 218 such as one or more I/O devices, storage, one or more communication devices (e.g., wireless networking, wired networking, etc.), etc.

In some examples, one or more of the cores 202(A)-(N) are capable of multi-threading. The system agent unit circuitry 210 includes those components coordinating and operating cores 202(A)-(N). The system agent unit circuitry 210 may include, for example, power control unit (PCU) circuitry and/or display unit circuitry (not shown). The PCU may be or may include logic and components needed for regulating the power state of the cores 202(A)-(N) and/or the special purpose logic 208 (e.g., integrated graphics logic). The display unit circuitry is for driving one or more externally connected displays.

The cores 202(A)-(N) may be homogenous in terms of instruction set architecture (ISA). Alternatively, the cores 202(A)-(N) may be heterogeneous in terms of ISA; that is, a subset of the cores 202(A)-(N) may be capable of executing an ISA, while other cores may be capable of executing only a subset of that ISA or another ISA.

The JTAG port 220 is an Institute of Electrical and Electronics Engineers (IEEE) 1149.1 Standard JTAG port. Data is written and read serially via the JTAG port 220 with one bit of data transferred in from TDI (Test Data In), and out to TDO (Test Data Out), serially per TCK (Test Clock) rising clock edge. Data is written and read serially via the JTAG port 220 with one bit of data transferred in from TDI, and out to TDO serially per TCK rising clock edge. The JTAG port 220 includes an instruction register 224 and a Test Access Port controller 226.

Modules (for example, Voltage droop monitors and Temperature sensors) in the SoC expose test access ports (TAPs). A host communicates with the TAPs via the JTAG port 220 by manipulating Test Mode Select (TMS) and TDI in conjunction with TCK, and reading results through TDO. Each TAP has one instruction register (IR) and multiple data registers (DR). The number of bits in the data registers varies between TAPs. The data registers are combined through TDI and TDO to form a large shift register. All information (instructions, test data, and test results) is communicated in a serial format.

Figure 3:
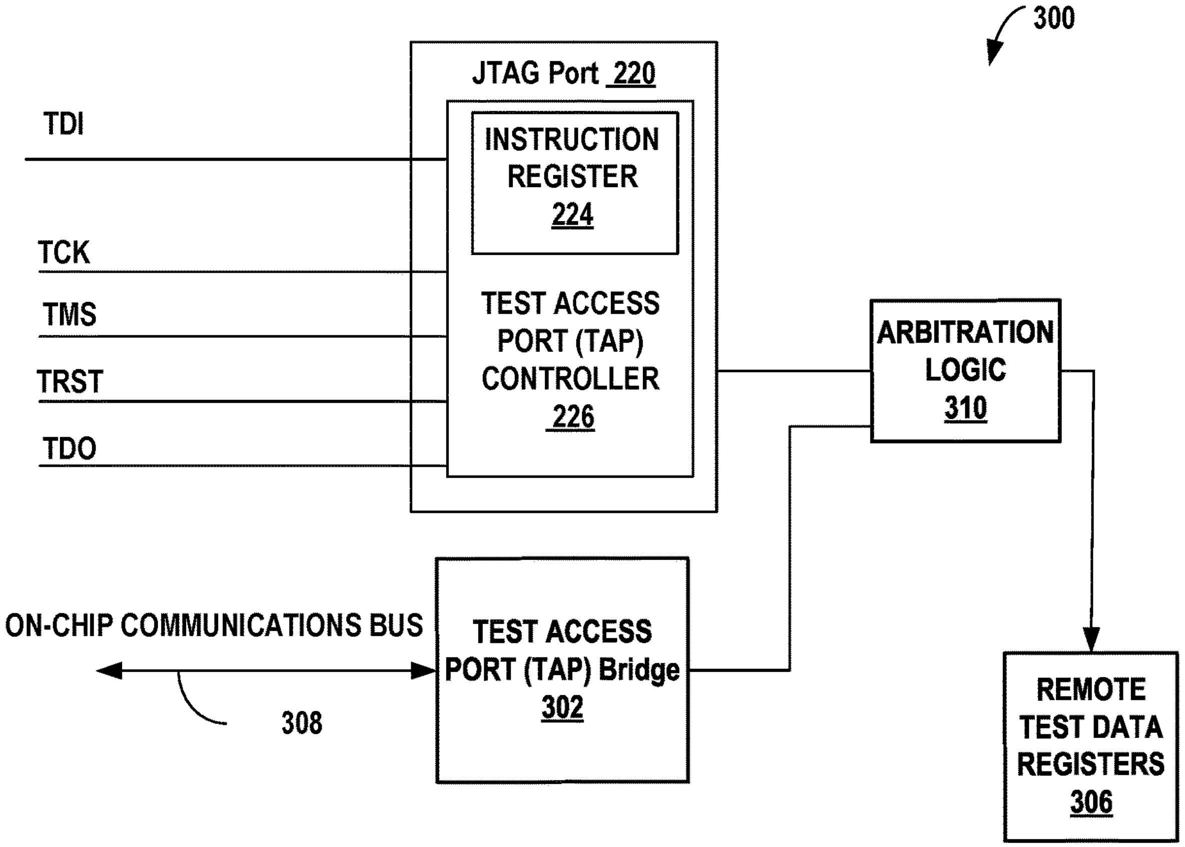
FIG. 3 is block diagram illustrating circuitry in a processor/SoC to access remote Test Data Registers.

FIG. 3 is block diagram illustrating circuitry 300 in a processor/SoC 200 to access remote Test Data Registers 306. Remote test data registers are registers that are outside the corresponding TAP controller. The registers inside the TAP controller are internal test data registers.

Arbitration logic 310 with one input coupled to the JTAG port 220 and another input coupled to a Test Access Port bridge 302 allows the remote Test Data Registers 306 to be accessed by the JTAG port 220 or the Test Access Port bridge 302.

The remote Test Data Registers 306 can be in different "blocks" or subsystems in the SoC 200. A core 202 in the SoC 200 can communicate with the Test Access Port bridge 302 over an on-chip communication bus 308. The on-chip communications bus 308 can be an APB (Advanced Peripheral Bus), an AXI (Advanced eXtensible Interface), an Intel® On-chip System Fabric (IOSF) sideband message interface (SB), an Intra Die Interconnect (IDI) bus, or an Advanced High-performance Bus (AHB).

The remote Test Data registers 306 can store critical parameters. Critical parameters are parameters that are required for operation of the system without disruption. Examples of critical parameters include, VDM (Voltage Droop Monitors), Voltage level monitors, TVM (Thermal Variation monitors), IDV (In-Die Variation Monitors), Duty Cycle and Skew monitors, and/or Performance Monitor (Perfmon) Counters. Voltage Droop monitors and Voltage level monitor voltage parameters. Thermal Variation monitors monitor thermal parameters. In-Die Variation Monitors are used for monitoring the process variation parameters of the chip after manufacture. Performance Monitor counters are used for monitoring the performance of the system. Duty Cycle and Skew monitors are used for monitoring clock parameters.

Figure 4:
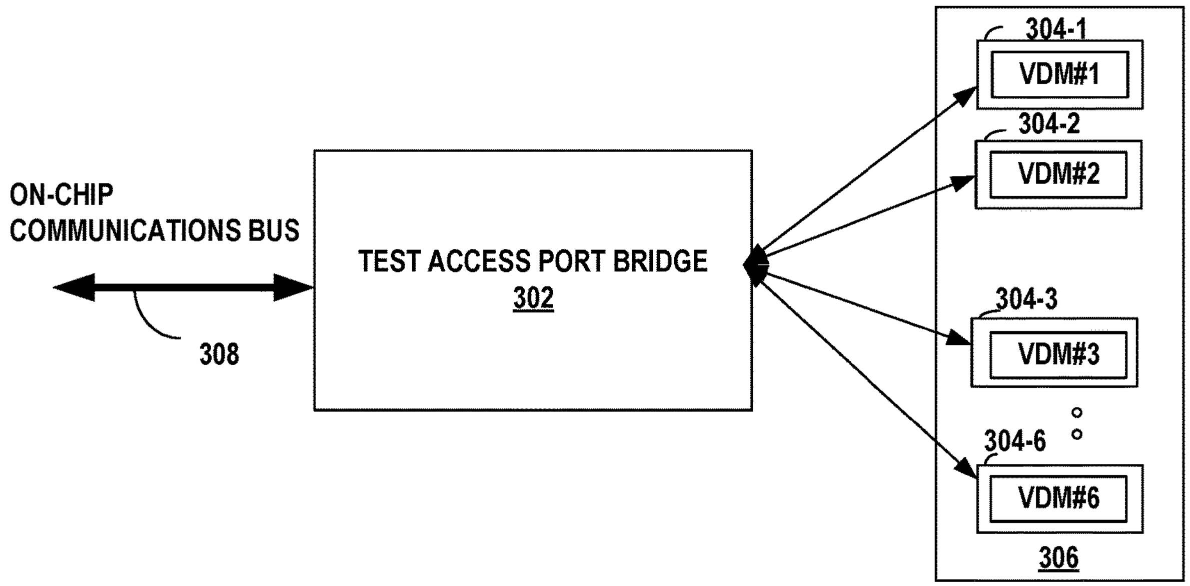
FIG. 4 is block diagram illustrating a plurality of subsystems in the SoC with each subsystem to perform the same function and including a same width JTAG remote Test Data Register.

FIG. 4 is block diagram illustrating a plurality of subsystems in the SoC 200 with each subsystem performing the same function and including a same width JTAG remote Test Data Register. In the example shown in FIG. 4 for Voltage Droop Monitors (VDM), there are multiple subsystems 304-1, 304-2, . . . , 304-6 and each subsystem 304-1, 304-2, . . . , 304-6 includes a Voltage Droop Monitor (VDM) count register labeled VDM1, VDM2, VDM10. Each VDM count register VDM1, VDM2, VDM6 has the same number of bits.

In this example, to read the data from the Voltage Droop Monitors (VDMs), which are identical subsystems 304-1, 304-2, . . . , 304-6, all the remote TDRs (VDM1, VDM2, VDM6) can be read in parallel reducing the test time based on the number of VDMs. For example, with 6 VDMs and 6 remote TDRs, the time to read the 6 VDMs can be reduced by 90%.

For example, if each Voltage Droop Monitor (VDM) count register has eight bits and there are 10 Voltage Droop Monitor (VDM) count registers to be read, if each Voltage Droop Monitor (VDM) count register is read serially, eight clock cycles are required to read each Voltage Droop Monitor (VDM) count register (one clock cycle per bit) and eighty clock cycles are required to read eight bits from each of the 10 Voltage Droop Monitor (VDM) count registers.

If the Instruction Register (IR) in the Test Access Port bridge 302 has 8 bits and each Voltage Droop Monitor (VDM) count register has eight bits, the number of TAP cycles to perform a read from one Voltage Droop Monitor count register is 24. 12 TAP cycles (Select IR (1), Capture_IR (1), Shift_IR(8), EXIT1-IR(1), Update IR) are required to program the instruction register and 12 TAP cycles (Select DR (1), Capture DR(1), Shift DR(8), EXIT1-DR(1) and Update_DR(1)) are required to read from the Voltage Droop Monitor count register. With 24 TAB cycles to read each Voltage Droop Monitor (VDM) count register, 6 Voltage Droop Monitor (VDM) count registers can be read serially in 144 TAP cycles. Only 24 TAP cycles are required if the 10 8-bit Voltage Droop Monitor (VDM) count registers are read in parallel by the Test Access Port bridge 302.

Figure 5:
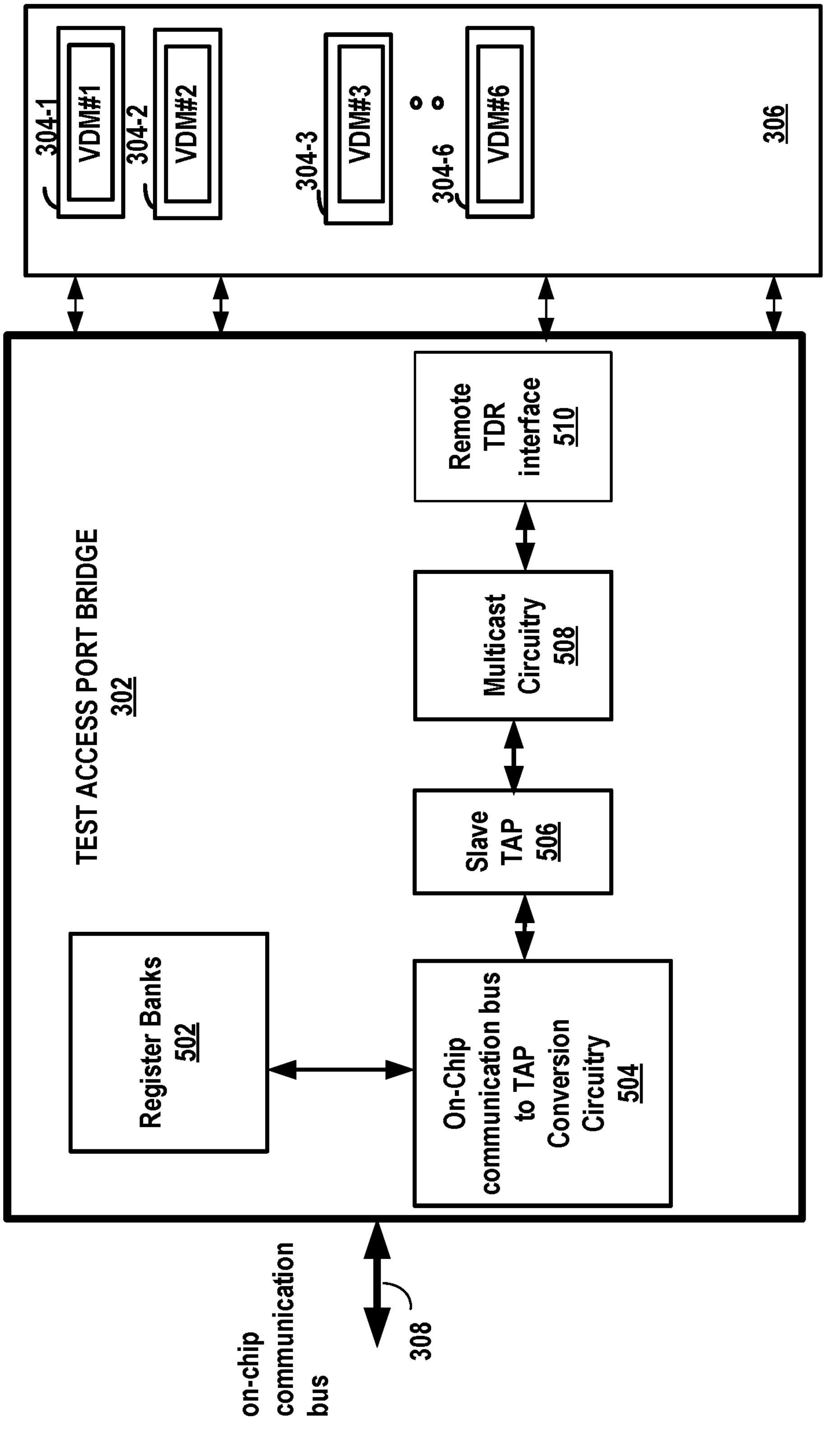
FIG. 5 is a block diagram illustrating an embodiment of the test access port bridge shown in FIG. 3.

FIG. 5 is a block diagram illustrating an embodiment of the test access port bridge 302 shown in FIG. 3. The test access port bridge 302 performs conversion of write/read requests to remote test data registers received on the on-chip communications bus 308 to the TAP protocol for the TAP serial bus.

The test access port bridge 302 includes register banks 502, On-Chip communication bus to TAP conversion circuitry 504, Slave Test Access Port (sTAP) 506, Multicast circuitry 508 and Remote TDR interface 510.

Register banks 502 include a set of registers used to convert from the on-chip communications bus protocol to the TAP protocol. For example, an on-chip communications bus protocol can include a write transaction or a read transaction, address and data. The TAP protocol is a serial protocol with one bit of data transferred in from TDI, and out to TDO serially per TCK rising clock edge.

The On-Chip communication bus to TAP conversion circuitry 504 performs the conversion from the on-chip communications bus protocol to the TAP protocol. The Slave Test Access Port (sTAP) 506 is a state machine with transitions controlled by the Test Mode Select (TMS) signal received from the On-Chip communication bus to TAP conversion circuitry 504.

Multicast circuitry 508 sends (multicasts) the same TAP command across multiple remote TDR interfaces, enabling the remote TDR interfaces in parallel.

The remote TDR interface 510 includes multiple remote test data interfaces for multiple remote test data registers. Each remote test data interface includes TCK, TDI and TDO signal interfaces and Shift DR, Update_DR and Capture DR states.

Figure 6:
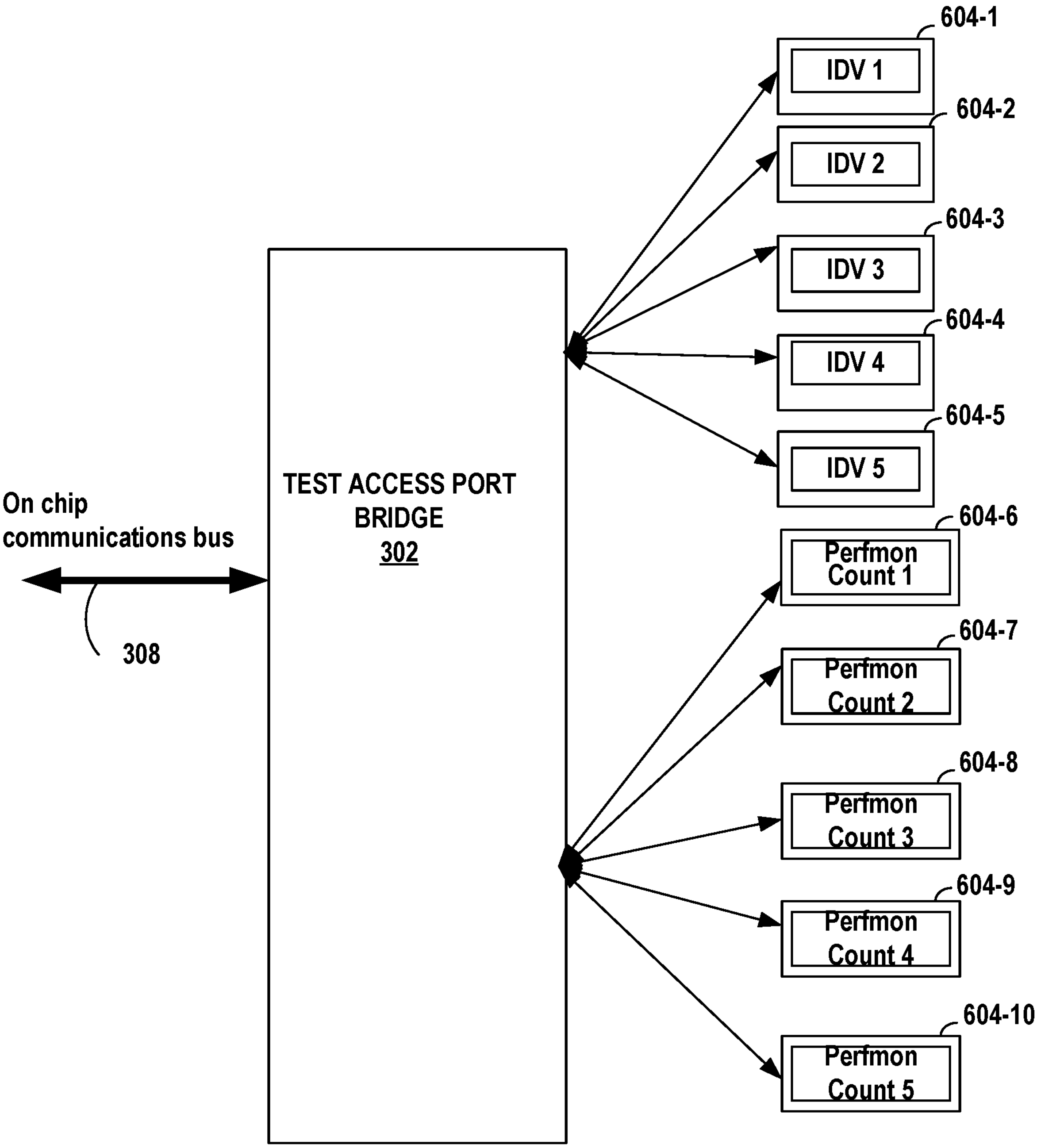
FIG. 6 is block diagram illustrating a plurality of subsystems in the SoC with a first set of subsystems performing a first function, a second set of subsystems performing a second function and the first set of subsystems and second set of subsystems including a same width JTAG remote Test Data Register.

FIG. 6 is block diagram illustrating a plurality of subsystems in the SoC 200 with a first set of subsystems performing a first function, a second set of subsystems performing a second function and the first set of subsystems and second set of subsystems including a same width JTAG remote Test Data Register.

Each of the five subsystems in the first set of subsystems 604-1, 604-2, 604-3, 604-4, 604-5 includes an In-Die Variation Monitors (IDV) counter register. Each of the five subsystems in the second set of subsystems 604-6, 604-7, 604-8, 604-9, 604-10 includes Performance Monitor (Perfmon) Counters.

In this example, to read the data from the In-Die Variation Monitors (IDV) counter registers, which are identical subsystems 604-1, 604-2, 604-3, 604-4, 604-5 and the data from all the performance counters, which are identical subsystems 604-6, 604-7, 604-8, 604-9, 604-10, with the In-Die Variation Monitors (IDV) counter registers and the performance counters having the same number of bits, all the remote TDRs (IDV1, IDV2, IDV3, IDV4, IDV5, Perf Counter 1, Perf Counter 2, Perf Counter 3, Perf Counter 4, Perf Counter 5) can be read in parallel reducing the test time based on the number of IDVs and Perf Counters. For example, with 5 IDVs, 5 Perf Counters and 10 remote TDRs, the time to read the 5 IDVs and 5 Perf Counters can be reduced by 90% with the total number of bits to be shifted reduced from 80 bits to 8 bits.

Figure 7:
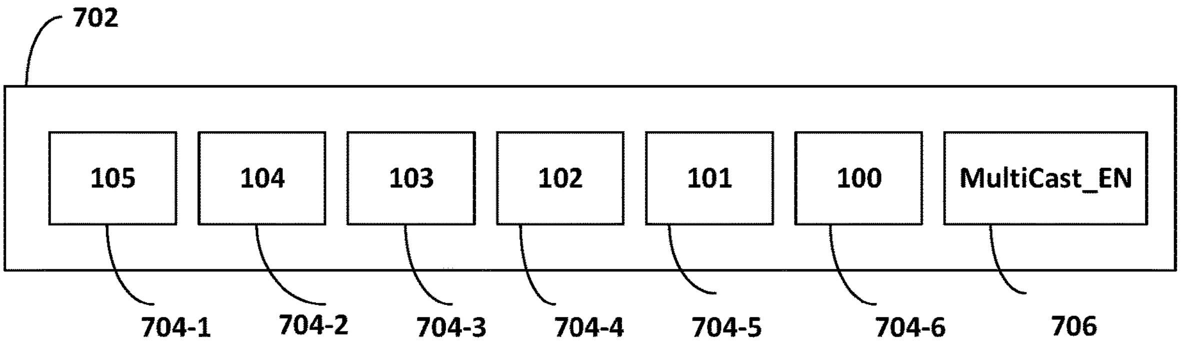
FIG. 7 is a block diagram of a multicast select register in the test access port bridge shown in FIG. 5 that can be used to multicast to the VDM registers shown in FIG. 4.

FIG. 7 is a block diagram of a multicast select register 702 in the register banks 502 in the test access port bridge 302 shown in FIG. 5 that can be used to multicast to the VDM registers shown in FIG. 4. The multicast select register 702 stores a register identifier for each VDM register. In the example shown in FIG. 7, the multicast select register 702 stores six register identifiers, with register identifier 704-1 pointing to VDM register in subsystem 304-1, register identifier 704-2 pointing to VDM register in subsystem 304-2, register identifier 704-3 pointing to VDM register 304-3, and register identifier 704-6 pointing to VDM register 304-6.

In the example shown in FIG. 7, the register identifiers written to the multicast register are 100, 101, 102, 103, 104, and 105. The multicast select register 702 also includes a Multicast Enable bit (MultiCast_EN) bit 706 that is set to '1' to enable the VDM registers to be read in parallel.

Figure 8:
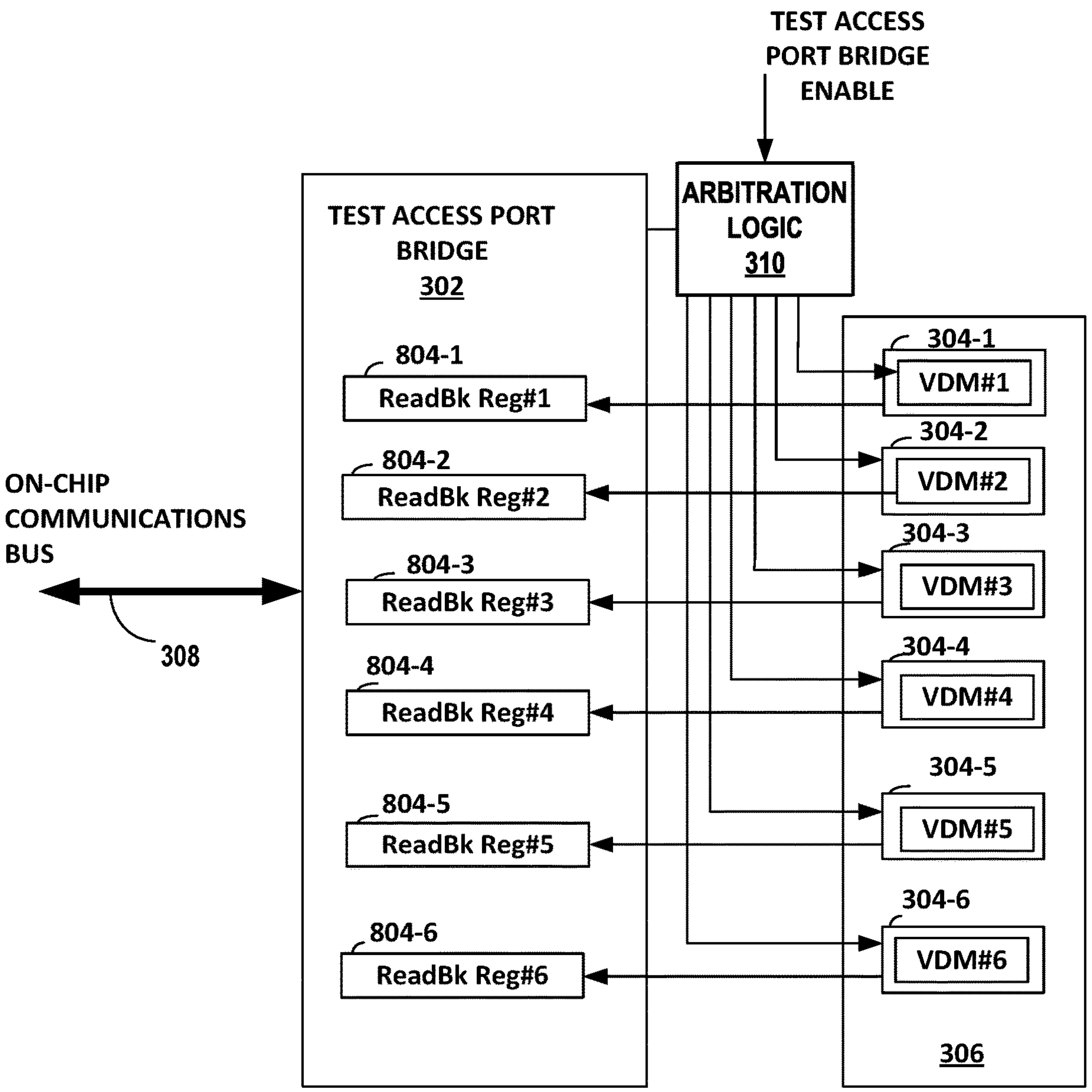
FIG. 8 is a block diagram illustrating read of Test Data Registers in parallel.

FIG. 8 is a block diagram illustrating read of Test Data Registers in parallel. In the example shown in FIG. 8 there are 6 VDM registers in subsystems 304-1, . . . , 304-6 to be read in parallel. The VDM registers to be accessed in parallel are selected in the multicast select register 702 and multicast is enabled by setting the Multicast_EN (MultiCast_EN) bit 706 in the multicast enable register to logic '1'.

Each of the VDM registers in subsystems 304-1, . . . , 304-6 is enabled for read via arbitration logic 310 Each of the VDM registers in subsystems 304-1, . . . , 304-6 is associated with a respective ReadBk register 804-1, . . . , 804-6.

As data stored in each of the VDM registers in subsystems 304-1, . . . , 304-6 is shifted out, the serial data is shifted into the respective ReadBk register 804-1, . . . , 804-6. After the data stored in each of the VDM registers in subsystems 304-1, . . . , 304-6 is stored in the ReadBk registers 804-1, . . . , 804-6, the ReadBk registers 804-1, . . . , 804-6 can be accessed via the on-chip communications bus 308.

One or more of the remote Test Data Registers to be read serially in parallel may be further from the test access port bridge 302 than other remote Test Data Registers and need an additional clock cycle to ensure that the Test Data Register can be read without any setup timing issues.

Figure 9:
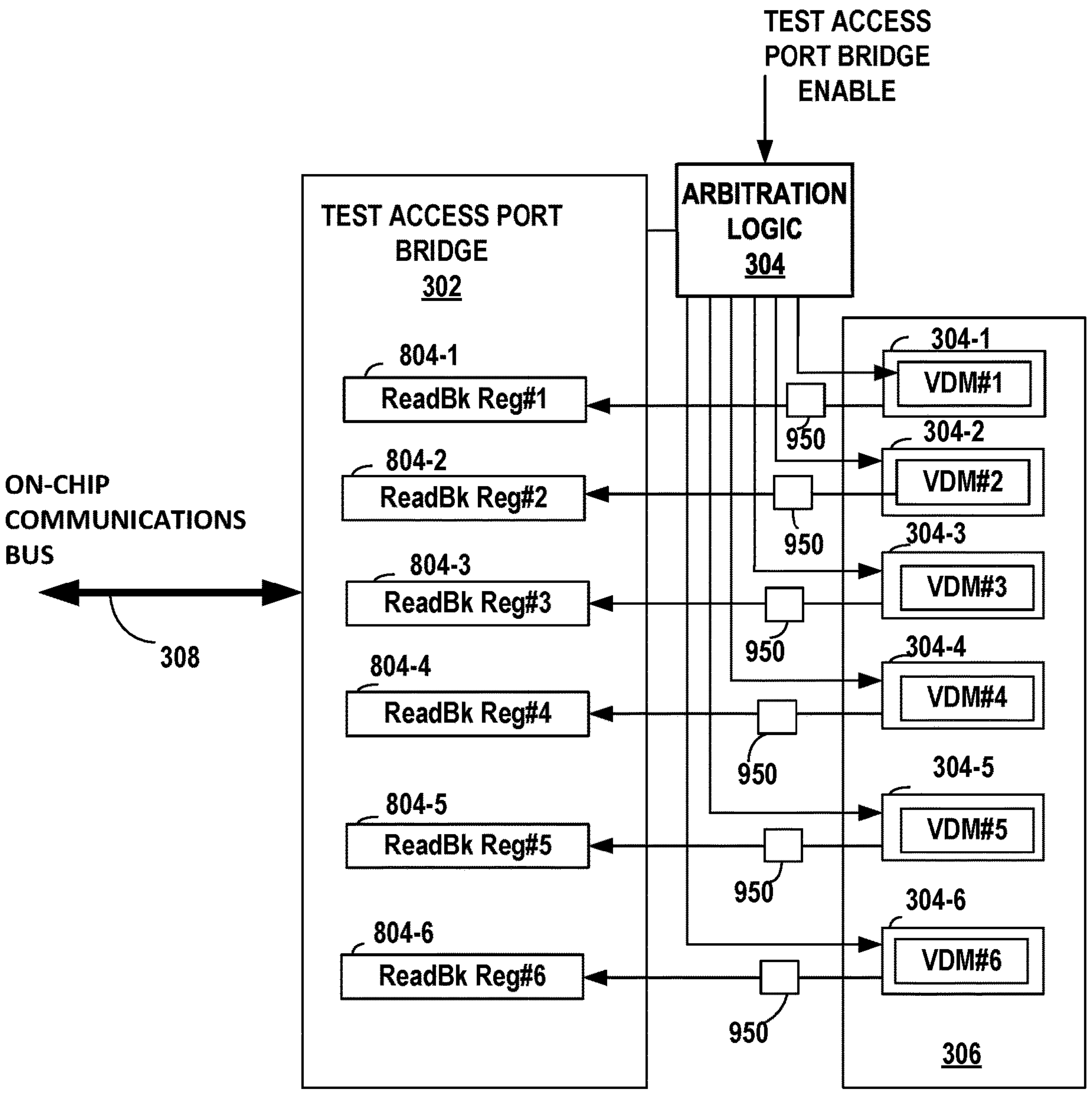
FIG. 9 is a block diagram illustrating read of Test Data Registers in parallel with a retiming flip flop added to each of the remote Test Data Registers.

FIG. 9 is a block diagram illustrating read of Test Data Registers in parallel with a retiming flip flop added to each of the remote Test Data Registers. The retiming flip flop 950 is added to the output of each of the remote Test Data Registers so that the number of shifts is increased from 8 to 9 for all the Test Data Registers that are read in parallel.

TAP operations can be performed at system level test via functional access. MBIST (Memory Built in Self-Test) can perform array/memory testing and LBIST (Logic Built in Self-Test) can perform logic testing array testing in parallel. The MBIST and LBIST can be programmed in parallel and the results can be read in parallel resulting in reduced test time.

The infield test firmware can be executed on a dedicated microcontroller or the main CPU in the SoC 200. The infield test firmware reads the temperature sensors, VDM, and/or Performance monitors for consumption by the CPU or to forward to another system, for example, a server communicatively coupled via a communications network to multiprocessor system 100.

Figure 10:
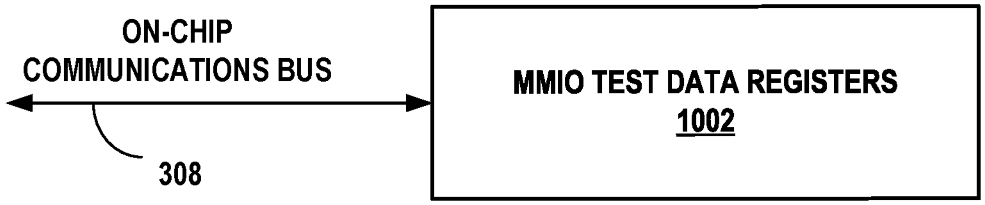
FIG. 10 is block diagram illustrating Direct Memory Mapped IO (MMIO) access via the on-chip communication bus to Memory Mapped Input Output (MMIO) remote Test Data Registers.

FIG. 10 is block diagram illustrating Direct Memory Mapped IO (MMIO) access via the on-chip communication bus 308 to Memory Mapped Input Output (MMIO) remote Test Data Registers 1002. Various critical parameters stored in the MMIO remote Test Data Registers 1002 are directly accessible via the on-chip communication bus 308. The MMIO remote Test Data Registers 1002 are mapped to address values and respond to a CPU (for example, core 202) access to the address value assigned to a Test Data Register in connecting the data bus to the MMIO remote Test Data Registers 1002 to read the data stored in the MMIO remote Test Data Registers 1002.

The MMIO Test Data Register can be in a Functional Unit Block (hereinafter referred to as a FUB-let). The FUB-let can include an interface to the on-chip communication bus 308. The MMIO Test Data register in the FUB-let is assigned a memory mapped IO address and can be accessed directly by a CPU using the memory mapped IO address via the on-chip communication bus 308.

The FUB-let can be a VDM (Voltage Droop Monitors) fub-let, an IDV (In-Die Variation Monitors) fub-let or a Performance Monitor (Perfmon) Counters fub-let. The on-chip communications bus 308 can be an APB (Advanced Peripheral Bus), an AXI (Advanced eXtensible Interface), an Intel® On-chip System Fabric (IOSF) sideband message interface (SB), or an Advanced High-performance Bus (AHB).

Direct access of the Test Data Registers by the CPU results in a reduction of the time taken to read the Test Data Registers. The JTAG protocol is a serial protocol with one bit read per clock cycle and the maximum frequency of the JTAG clock is 100 MHz. The AXI/ACPB protocol can read 32 to 64 bits per clock cycle and the clock frequency is about 1 GHz. Bandwidth using the AXI/ACPB protocol is about 32/64 Gigabits per second which is faster than the 100 Megabits per second provided by the JTAG protocol. Time to perform testing can be reduced between 93% to 99% dependent upon the latency of the on-chip communications bus used for Direct MMIO access.

A processor that uses the Test Access Port (TAP) bridge 302 to access the remote Test Data Registers or a processor that includes Memory Mapped Input Output (MMIO) remote Test Data Registers 1002 can be used in an Advanced Driving Assistance System (ADAS).

While various embodiments described herein use the term System-on-a-Chip or System-on-Chip ("SoC") to describe a device or system having a processor and associated circuitry (e.g., Input/Output ("I/O") circuitry, power delivery circuitry, memory circuitry, etc.) integrated monolithically into a single Integrated Circuit ("IC") die, or chip, the present disclosure is not limited in that respect. For example, in various embodiments of the present disclosure, a device or system can have one or more processors (e.g., one or more processor cores) and associated circuitry (e.g., Input/Output ("I/O") circuitry, power delivery circuitry, etc.) arranged in a disaggregated collection of discrete dies, tiles and/or chiplets (e.g., one or more discrete processor core die arranged adjacent to one or more other die such as memory die, I/O die, etc.). In such disaggregated devices and systems the various dies, tiles and/or chiplets can be physically and electrically coupled together by a package structure including, for example, various packaging substrates, interposers, active interposers, photonic interposers, interconnect bridges and the like. The disaggregated collection of discrete dies, tiles, and/or chiplets can also be part of a System-on-Package ("SoP").

Program code may be applied to input information to perform the functions described herein and generate output information. The output information may be applied to one or more output devices, in known fashion. For purposes of this application, a processing system includes any system that has a processor, such as, for example, a digital signal processor (DSP), a microcontroller, an application specific integrated circuit (ASIC), a field programmable gate array (FPGA), a microprocessor, or any combination thereof.

The program code may be implemented in a high-level procedural or object-oriented programming language to communicate with a processing system. The program code may also be implemented in assembly or machine language, if desired. In fact, the mechanisms described herein are not limited in scope to any particular programming language. In any case, the language may be a compiled or interpreted language.

Examples of the mechanisms disclosed herein may be implemented in hardware, software, firmware, or a combination of such implementation approaches. Examples may be implemented as computer programs or program code executing on programmable systems comprising at least one processor, a storage system (including volatile and non-volatile memory and/or storage elements), at least one input device, and at least one output device.

One or more aspects of at least one example may be implemented by representative instructions stored on a machine-readable medium which represents various logic within the processor, which when read by a machine causes the machine to fabricate logic to perform the techniques described herein. Such representations, known as "intellectual property (IP) cores" may be stored on a tangible, machine readable medium and supplied to various customers or manufacturing facilities to load into the fabrication machines that make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, examples also include non-transitory, tangible machine-readable media containing instructions or containing design data, such as Hardware Description Language (HDL), which defines structures, circuits, apparatuses, processors and/or system features described herein. Such examples may also be referred to as program products.

In some cases, an instruction converter may be used to convert an instruction from a source instruction set architecture to a target instruction set architecture. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

References to "one example," "an example," etc., indicate that the example described may include a particular feature, structure, or characteristic, but every example may not necessarily include the particular feature, structure, or characteristic. Moreover, such phrases are not necessarily referring to the same example. Further, when a particular feature, structure, or characteristic is described in connection with an example, it is submitted that it is within the knowledge of one skilled in the art to affect such feature, structure, or characteristic in connection with other examples whether or not explicitly described.

Moreover, in the various examples described above, unless specifically noted otherwise, disjunctive language such as the phrase "at least one of A, B, or C" or "A, B, and/or C" is intended to be understood to mean either A, B, or C, or any combination thereof (i.e. A and B, A and C, B and C, and A, B and C).

The specification and drawings are, accordingly, to be regarded in an illustrative rather than a restrictive sense. It will, however, be evident that various modifications and changes may be made thereunto without departing from the broader spirit and scope of the disclosure as set forth in the claims.

EXAMPLES

Illustrative examples of the technologies disclosed herein are provided below. An embodiment of the technologies may include any one or more, and any combination of, the examples described below.

Example 1 is a processor including remote test data registers, a JTAG (Joint Test Action Group) port and a Test Access Port Bridge. The JTAG (Joint Test Action Group) port including a serial communications interface to provide access to the remote test data registers. Test Access Port Bridge to provide access to a subset of the remote test data registers in parallel Example 2 includes the processor of Example 1, optionally the subset of the remote test data registers are the same width Example 3 includes the processor of Example 2, optionally the same width is N bits.

Example 4 includes the processor of Example 2, optionally each remote test data register in the subset of the remote test data registers is included in a subsystem and each subsystem to perform a same function.

Example 5 includes the processor of Example 2, optionally each remote test data register in the subset of the remote test data registers is included in one of a plurality of subsystems, the plurality of subsystems to perform different functions.

Example 6 includes the processor of Example 1, optionally the Test Access Port Bridge to receive a request to access a subset of the remote test data registers via an on-chip communications bus.

Example 7 includes the processor of Example 6, optionally the on-chip communications bus is Advanced Peripheral Bus (APB), an Advanced eXtensible Interface (AXI) or an Advanced High-performance Bus (AHB).

Example 8 includes the processor of Example 1, optionally the remote test data registers include an In-Die Variation Monitors (IDV) counter register and a Voltage Droop Monitor (VDM) register.

Example 9 is a system including a system memory to store instructions and data and a processor coupled to the memory to execute the instructions. The processor including remote test data registers, a JTAG (Joint Test Action Group) port and a Test Access Port Bridge. The JTAG (Joint Test Action Group) port including a serial communications interface to provide access to the remote test data registers. Test Access Port Bridge to provide access to a subset of the remote test data registers in parallel Example 10 includes the system of Example 9, optionally the subset of the remote test data registers are the same width Example 11 includes the system of Example 10, optionally the same width is N bits.

Example 12 includes the system of Example 10, optionally each remote test data register in the subset of the remote test data registers is included in a subsystem and each subsystem to perform a same function.

Example 13 includes the system of Example 10, optionally each remote test data register in the subset of the remote test data registers is included in one of a plurality of subsystems, the plurality of subsystems to perform different functions.

Example 14 includes the system of Example 9, optionally the Test Access Port Bridge to receive a request to access a subset of the remote test data registers via an on-chip communications bus.

Example 15 includes the system of Example 9, optionally the on-chip communications bus is Advanced Peripheral Bus (APB), an Advanced eXtensible Interface (AXI) or an Advanced High-performance Bus (AHB).

Example 16 includes the system of Example 9, optionally the remote test data registers include an In-Die Variation Monitors (IDV) counter register and a Voltage Droop Monitor (VDM) register.

Example 17 is a method including providing, by a JTAG (Joint Test Action Group) port in a processor access to remote test data registers in the processor, the JTAG port including a serial communications interface and providing, by a Test Access Port Bridge access to a subset of the remote test data registers in parallel.

Example 18 includes the method of Example 17, optionally the subset of the remote test data registers are the same width Example 19 includes the method of Example 18, optionally the same width is N bits.

Example 20 includes the method of Example 18, optionally each remote test data register in the subset of the remote test data registers is included in a subsystem and each subsystem to perform a same function.

Example 21 includes the method of Example 18, optionally each remote test data register in the subset of the remote test data registers is included in one of a plurality of subsystems, the plurality of subsystems to perform different functions.

Example 22 includes the method of Example 17, optionally the Test Access Port Bridge to receive a request to access a subset of the remote test data registers via an on-chip communications bus.

Example 23 includes the method of Example 22, optionally the on-chip communications bus is Advanced Peripheral Bus (APB), an Advanced eXtensible Interface (AXI) or an Advanced High-performance Bus (AHB).

Example 24 includes the method of Example 17, optionally the remote test data registers include an In-Die Variation Monitors (IDV) counter register and a Voltage Droop Monitor (VDM) register.

Example 25 is an apparatus comprising means for performing the methods of any one of the Examples 17 to 24.

Example 26 is a machine readable medium including code, when executed, to cause a machine to perform the method of any one of examples 17 to 24.

Example 27 is a machine-readable storage including machine-readable instructions, when executed, to implement the method of any one of examples 17 to 24.

What is claimed is:

1. A processor comprising:
remote test data registers;
a JTAG (Joint Test Action Group) port including a serial communications interface to provide access to the remote test data registers; and
a Test Access Port Bridge to provide access to a subset of the remote test data registers in parallel, wherein the subset of the remote test data registers are same width.

2. The processor of claim 1, wherein the same width is N bits.

3. The processor of claim 1, wherein each remote test data register in the subset of the remote test data registers is included in a subsystem and each subsystem to perform a same function.

4. The processor of claim 1, wherein each remote test data register in the subset of the remote test data registers is included in one of a plurality of subsystems, the plurality of subsystems to perform different functions.

5. The processor of claim 1, wherein the Test Access Port Bridge to receive a request to access a subset of the remote test data registers via an on-chip communications bus.

6. The processor of claim 5, wherein the on-chip communications bus is Advanced Peripheral Bus (APB), an Advanced extensible Interface (AXI) or an Advanced High-performance Bus (AHB).

7. The processor of claim 1, wherein the remote test data registers include an In-Die Variation Monitors (IDV) counter register and a Voltage Droop Monitor (VDM) register.

8. A system comprising:
memory to store instructions and data; and
a processor coupled to the memory to execute the instructions, the processor comprising:
remote test data registers;
a JTAG (Joint Test Action Group) port including a serial communications interface to provide access to the remote test data registers; and
a Test Access Port Bridge to provide access to a subset of the remote test data registers in parallel, wherein the Test Access Port Bridge to receive a request to access a subset of the remote test data registers via an on-chip communications bus and the on-chip communications bus is Advanced Peripheral Bus (APB), an Advanced extensible Interface (AXI) or an Advanced High-performance Bus (AHB).

9. The system of claim 8, wherein the subset of the remote test data registers are a same width.

10. The system of claim 9, wherein the same width is N bits.

11. The system of claim 9, wherein each remote test data register in the subset of the remote test data registers is included in a subsystem and each subsystem to perform a same function.

12. The system of claim 9, wherein each remote test data register in the subset of the remote test data registers is included in one of a plurality of subsystems, the plurality of subsystems to perform different functions.

13. The system of claim 8, wherein the remote test data registers include an In-Die Variation Monitors (IDV) counter register and a Voltage Droop Monitor (VDM) register.

14. A method comprising:
providing, by a JTAG (Joint Test Action Group) port in a processor access to remote test data registers in the processor, the JTAG port including a serial communications interface; and
providing, by a Test Access Port Bridge access to a subset of the remote test data registers in parallel, wherein the remote test data registers include an In-Die Variation Monitors (IDV) counter register and a Voltage Droop Monitor (VDM) register.

15. The method of claim 14, wherein the subset of the remote test data registers are a same width.

16. The method of claim 15, wherein the same width is N bits.

17. The method of claim 15, wherein each remote test data register in the subset of the remote test data registers is included in a subsystem and each subsystem to perform a same function.

18. The method of claim 15, wherein each remote test data register in the subset of the remote test data registers is included in one of a plurality of subsystems, the plurality of subsystems to perform different functions.

19. The method of claim 14, wherein the Test Access Port Bridge to receive a request to access a subset of the remote test data registers via an on-chip communications bus.

20. The method of claim 19, wherein the on-chip communications bus is Advanced Peripheral Bus (APB), an Advanced extensible Interface (AXI) or an Advanced High-performance Bus (AHB).

* * * * *